United States Patent
Tamaki

[11] Patent Number: 5,258,663
[45] Date of Patent: Nov. 2, 1993

[54] REFERENCE VOLTAGE GENERATING CIRCUIT HAVING REDUCED POWER CONSUMPTION

[75] Inventor: Satoshi Tamaki, Tokyo, Japan
[73] Assignee: NEC Corporation, Tokyo, Japan
[21] Appl. No.: 725,482
[22] Filed: Jul. 3, 1991
[30] Foreign Application Priority Data
   Jul. 10, 1990 [JP] Japan .................. 2-182039
[51] Int. Cl.$^5$ ............................................ H03K 17/00
[52] U.S. Cl. ................................ 307/296.5; 307/296.8;
   307/246; 307/451; 307/585; 307/558
[58] Field of Search ............... 307/296.5, 296.8, 270,
   307/246, 451, 585, 558, 559

[56] References Cited
U.S. PATENT DOCUMENTS

| | | | |
|---|---|---|---|
| 4,612,464 | 9/1986 | Ishikawa et al. | 307/270 |
| 4,678,943 | 7/1987 | Uragami et al. | 307/270 |
| 4,788,455 | 11/1988 | Mori et al. | 323/314 |
| 4,857,770 | 8/1989 | Partovi et al. | 307/296.8 |
| 4,933,627 | 6/1990 | Hara | 323/313 |
| 5,008,609 | 4/1991 | Fukiage | 307/296.8 |

Primary Examiner—William L. Sikes
Assistant Examiner—Scott A. Ouellette
Attorney, Agent, or Firm—Leydig, Voit & Mayer

[57] ABSTRACT

According to this invention, a reference voltage generating circuit includes a first series circuit, a second series circuit, and a control circuit. The first series circuit is constituted by a first resistor, a first transistor, a second transistor, and the second resistor connected in series between power source terminals. The second series connection circuit is constituted by third and fourth transistors which have control electrodes respectively connected to a connection point between the first resistor and the first transistor and a connection point between the second resistor and the second transistor, are connected in series between the power source terminals, and have a common connection point serving as a reference voltage output terminal. The control circuit sequentially ON/OFF-controls the first and second transistors by a control signal.

8 Claims, 2 Drawing Sheets

REFERENCE VOLTAGE GENERATING CIRCUIT HAVING REDUCED POWER CONSUMPTION

BACKGROUND OF THE INVENTION

The present invention relates to a reference voltage generating circuit and, more particularly, to a reference voltage generating circuit for applying a reference voltage of ½ a power source voltage $V_{CC}$ to a digit line or the like in a semiconductor memory device.

As shown in FIG. 4, a conventional reference voltage generating circuit comprises a resistor R1 having one terminal connected to the power source terminal of a power source voltage $V_{CC}$, a resistor R2 having one terminal connected to the ground terminal of a reference potential, an n-type transistor Q3 having the drain and gate connected to the other terminal of the resistor R1, a p-type transistor Q4 having the drain and gate connected to the other terminal of the resistor R2 and the source connected to the source of the transistor Q3, an n-type transistor Q7 having the drain connected to the power source terminal and the gate connected to the drain and gate of the transistor Q3, and a transistor Q8. The transistor Q8 has the drain connected to the ground terminal, the gate connected to the drain and gate of the transistor Q4, and the source connected to the source of the transistor Q7 and used as the output terminal of a reference voltage $V_{OUT}$. A current flows in a path of the resistor R1, the transistors Q3 and Q4, and the resistor R2 and a path of the transistors Q7 and Q8, thereby generating a reference voltage of ½ a power source voltage $V_{CC}$. The reference voltage is applied to a digit line as a precharge voltage or to a counter electrode of a memory cell.

Since the digit line and the counter electrode of the memory cell are regarded as capacitors each having a large capacitance, a reference voltage need not always be applied to the digit line and the counter electrode. However, the above conventional reference voltage generating circuit has a structure in which a current always flows in the path of the resistors R1 and R2 and the transistors Q3 and Q4 and the path of the transistors Q7 and Q8. Therefore, a power is disadvantageously consumed more than necessary.

SUMMARY OF THE INVENTION

It is an object of the present invention to provide a reference voltage generating circuit capable of reducing power consumption.

It is another object of the present invention to provide a reference voltage generating circuit capable of generating a stable reference voltage only when it is required.

The present invention achieves these objects with a reference voltage generating circuit including a first series circuit having a first resistor, a first transistor, a second transistor, and a second resistor coupled in series between power source terminals. A second series connection circuit including third and fourth transistors which have control electrodes respectively connected to a connection point between the first resistor and the first transistor and a connection point between the second resistor and the second transistor are connected is series between said power source terminals and have a common connection point serving as a reference voltage output terminal. A control circuit is coupled to the first series circuit for sequentially ON/OFF-controlling the first and second transistors by a control signal. The ON/OFF-controlling of the first and second transistor decreases the current flow in the first series connection circuit and decreases power consumption of the reference voltage generating circuit. A capacitor, connected to a connection point between the first and second transistors, stores a potential of the connection point between the first and second transistors.

DESCRIPTION OF THE PREFERRED EMBODIMENTS

Embodiments of the present invention will be described below with reference to the accompanying drawings.

Figure 1:
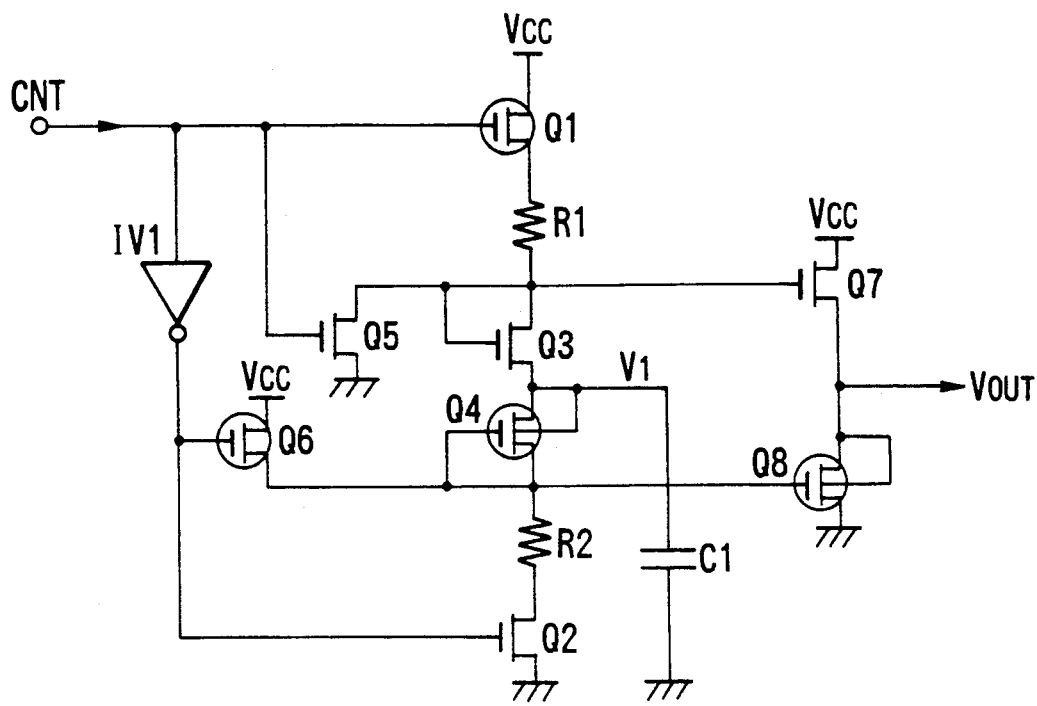
FIGS. 1 and 2 are circuit diagrams, respectively, showing the first and second embodiments of the present invention.

FIG. 1 shows the first embodiment of the present invention.

In this embodiment, a reference voltage generating circuit comprises a p-type first transistor Q1, an inverter IV1, an n-type second transistor Q2, a first resistor R1, a second resistor R2, an n-type third transistor Q3, a p-type fourth transistor Q4, a capacitor C1, an n-type fifth transistor Q5, a p-type sixth transistor Q6, an n-type seventh transistor Q7, and a p-type eighth transistor. The p-type first transistor Q1 has the source connected to the first power source terminal applied with a power source voltage $V_{CC}$ and the gate to which a control signal CNT is input. The inverter IV1 inverts the level of the control signal CNT. The n-type second transistor Q2 has the source connected to the ground terminal of the second power source terminal and the gate connected to the output terminal of the inverter IV1. The first resistor R1 has one terminal connected to the drain of the first transistor Q1. The second resistor R2 has one terminal of the transistor Q2. The n-type third transistor Q3 has the drain and gate connected to the other terminal of the first resistor R1. The p-type fourth transistor Q4 has the drain and gate connected to the other terminal of the second resistor R2 and has the source and substrate connected to the source of the third transistor Q3. The capacitor C1 has one terminal connected to the source of the fourth transistor and the other terminal connected to the ground terminal. The n-type fifth transistor Q5 has the source connected to the ground terminal, the drain connected to the gate and drain of the third transistor Q3, and the gate to which the control signal CNT is input. The p-type sixth transistor Q6 has the source connected to the first power source terminal, the drain connected to the gate and drain of the fourth transistor Q4, and the gate connected to the output terminal of the inverter IV1. The n-type seventh transistor Q7 has the drain connected to the first power source terminal and the gate connected to the drain and gate of the third transistor Q3. The p-type eighth transistor Q8 has the drain connected to the ground terminal, the gate connected to the drain and gate of the fourth transistor Q4, and the source and substrate connected to the source of the seventh transistor Q7. The eighth transistor Q8 has the source as the output terminal of a reference voltage $V_{OUT}$.

The operation of this embodiment will be described below.

When the control signal CNT goes to low level, the transistor Q1 is turned on, the transistors Q5 and Q6 are turned off, and the transistor Q2 is turned on. Therefore, a current flows from the power source terminal to the ground terminal through a path constituted by the transistor Q1, the resistor R1, the transistor Q3, the transistor Q4, the resistor R2, and the transistor Q2.

At this time, assume that the resistors R1 and R2 have resistances $R_1$ and $R_2$, respectively, that each p-type transistor has a threshold value $V_{TP}$, and that each n-type transistor has a threshold value $V_{TN}$. In this case, a connection point potential $V_1$ between the sources of the transistors Q3 and Q4 generated by a current $I_1$ flowing through the above path is stably give by the following equation:

$$V_1 = (V_{CC} - V_{TP} - V_{TN}) \times \frac{R_2}{R_1 + R_2} + V_{TP}$$

For example, if $V_{TP} = V_{TN}$ and $R_1 = R_2$ then, $V_1 = V_{CC}/2$.

At this time, the transistors Q3 and Q7 have a common gate potential, and the transistors Q4 and Q8 have a common gate potential. Therefore, the connection point potential between the transistors Q3 and Q4 is equal to the potential of the output terminal of the reference voltage $V_{OUT}$.

When the control signal goes to high level, the transistor Q1 is turned off, the transistors Q5 and Q6 are turned on, and the transistor Q2 is turned off. The gates of the transistors Q4 and Q8 have a power source voltage $V_{CC}$, and the transistors Q4 and Q8 are turned off. Therefore, since the reference voltage generating circuit becomes inactive as a whole, the output terminal of the reference voltage $V_{OUT}$ is set in a high-impedance state so that the reference voltage generating circuit does not consume any current.

At this time, the capacitor C1 retains a potential $V_1$ obtained immediately before the circuit is set to be inactive. The capacitor C1 prepares for a case wherein the control signal CNT is input to activate the circuit again.

Note that a switch corresponding to the transistors Q1 and Q2 may be connected in series with the transistors Q7 and Q8 to be ON/OFF-controlled by the control signal CNT. In this case, the transistors Q1 and Q2 can be omitted.

Figure 2:
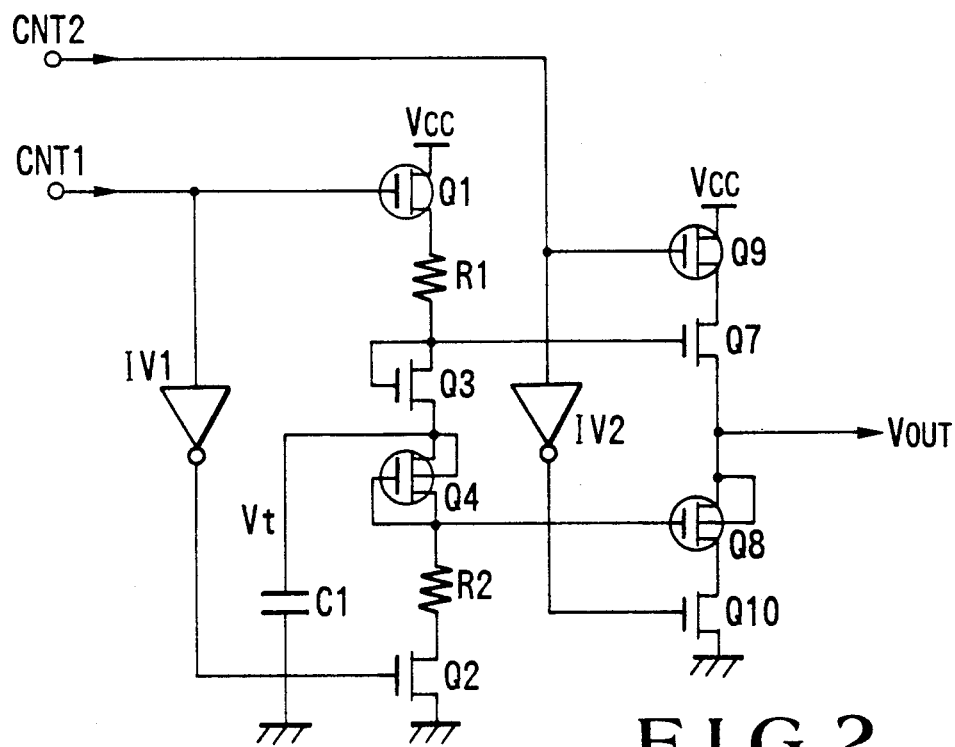

FIG. 2 shows the second embodiment of the present invention.

According to this embodiment, a reference voltage generating circuit comprises a first transistor Q1, a first inverter IV1, a second transistor Q2, a first resistor R1, a second resistor R2, a third transistor Q3, a fourth transistor Q4, a capacitor C1, a p-type fifth transistor Q9, a second inverter IV2, an n-type sixth transistor Q10, an n-type seventh transistor Q7, and a p-type eighth transistor Q8. The first transistor Q1 has the same connection arrangement as in the first embodiment in FIG. 1 except that a first control signal CNT1 is input to the gate of the transistor Q1. The p-type fifth transistor Q9 has the source to which a power source voltage $V_{CC}$ is supplied and the gate to which a second control signal CNT2 is supplied. The second inverter IV2 converts the level of the second control signal CNT2. The n-type sixth transistor Q10 has the source connected to the ground terminal of the second power source terminal and the gate connected to the output terminal of the second inverter IV2. The n-type seventh transistor Q7 has the drain connected to the drain of the transistor Q9 and the gate connected to the drain and gate of the third transistor Q3. The p-type eighth transistor Q8 has the drain connected to the drain of the sixth transistor Q10, the gate connected to the drain and gate of the fourth transistor Q4, and the source connected to the source of the seventh transistor Q7. The eighth transistor Q8 has the source as the output terminal of a reference voltage $V_{OUT}$.

Figure 3:
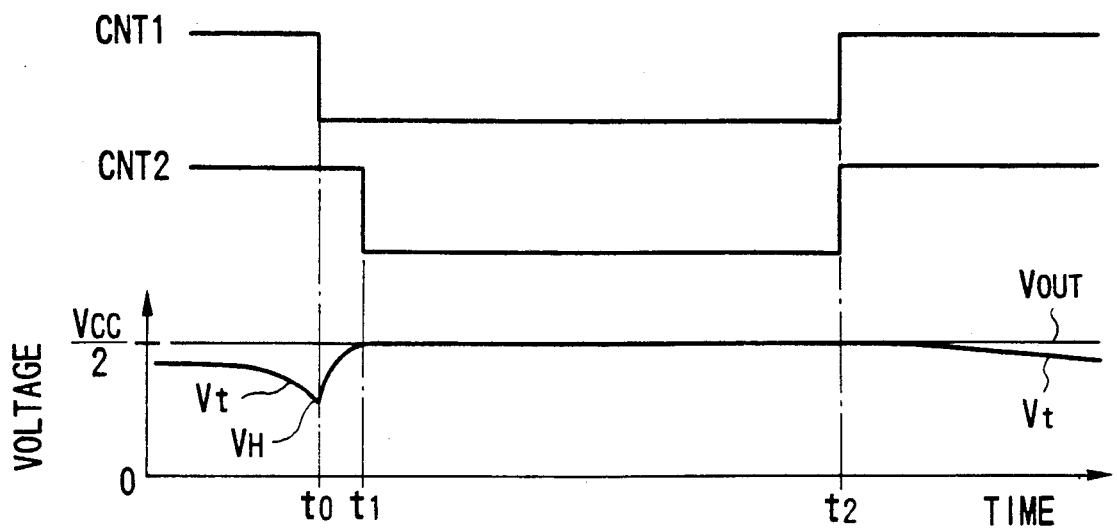
FIG. 3 is a timing chart showing signal waveforms for explaining an operation of the embodiment in FIG. 2.
Figure 4:
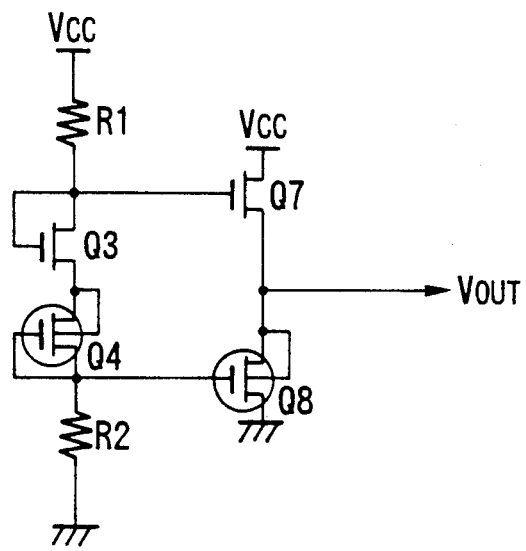
FIG. 4 is a circuit diagram showing a conventional reference voltage generating circuit.

In this embodiment, as shown in FIG. 3, the control signal CNT1 is set to be low level to stabilize the potential of the capacitor C1. Thereafter, the control signal CNT2 is set to be low level, thereby obtaining an output which is stabler than the output obtained in the first embodiment.

In this case, when the potential of the capacitor C1 immediately before the control signal CNT1 is set to be low level is set at a potential $V_H$, the potential $V_t$ of the capacitor C1 upon a lapse of time t after the control signal CNT1 is set to be low level is given by the following equation:

$$V_t = \left\{ \frac{R_2}{R_1 + R_2} (V_{CC} - V_{TP} - V_{TN}) + V_{TP} - V_H \right\} \times$$

$$\left\{ 1 - \exp\left( -\frac{R_1 + R_2}{CR_1 R_2} t \right) \right\}$$

The resistances $R_1$ and $R_2$ of the resistors R1 and R2 and the capacitance C of the capacitor C1 are determined by this equation, thereby determining a time difference between the control signals CNT1 and CNT2.

As described above, since the reference voltage generating circuit according to the present invention can generate a stable reference voltage only when the voltage is required, waste of power consumption is suppressed, and the power consumption can be decreased.

What is claimed is:

1. A reference voltage generating circuit comprising:
a first series circuit including a first resistor, a first transistor, a second transistor, and a second resistor coupled in series between power source terminals:
a second series connection circuit including third and fourth transistors which have control electrodes respectively connected to a connection point between said first resistor and said first transistor and a connection point between said second resistor and said second transistor, are connected is series between said power source terminals, and have a common connection point serving as a reference voltage output terminal;
a control circuit, coupled to the first series circuit, for sequentially ON/OFF-controlling said first and second transistors by a control signal, and wherein the ON/OFF-controlling of said first and second transistor decreases the current flow in the first series connection circuit and decreases power consumption of the reference voltage generating circuit; and
a capacitor, connected to a connection point between said first and second transistors, for storing a potential of the connection point between said first and second transistors.

2. A reference voltage generating circuit comprising:
a first series circuit including a first resistor, a first transistor, a second transistor, and a second resistor coupled in series between power source terminals;
a second series connection circuit including third and fourth transistors which have control electrodes respectively connected to a connection point between said first resistor and said first transistor and a connection point between said second resistor and said second transistor, are connected is series between said power source terminals, and have a common connection point serving as a reference voltage output terminal;
a control circuit, coupled to the first series circuit, for sequentially ON/OFF-controlling said first and second transistors by a control signal, and wherein the ON/OFF-controlling of said first and second transistor decreases the current flow in the first series connection circuit and decreases power consumption of the reference voltage generating circuit;
a power source switch, connected in series with said first series circuit, for ON/OFF-controlling a power source to said circuit by the control signal, the power source switch being coupled to interrupt the flow of current in the first series circuit; and
wherein said switch includes two transistors, each transistor being respectively connected in series between said first series and the power source terminals, to be synchronously operated.

3. A reference voltage generating circuit comprising:
a first series circuit including a first resistor, a first transistor, a second transistor, and a second resistor coupled in series between power source terminals;
a second series connection circuit including third and fourth transistors which have control electrodes respectively connected to a connection point between said first resistor and said first transistor and a connection point between said second resistor and said second transistor, are connected is series between said power source terminals, and have a common connection point serving as a reference voltage output terminal;
a control circuit, coupled to the first series circuit, for sequentially ON/OFF-controlling said first and second transistors by a control signal, and wherein the ON/OFF-controlling of said first and second transistor decreases the current flow in the first series connection circuit and decreases power consumption of the reference voltage generating circuit; and
a power source switch, connected in series with said second series circuit, for ON/OFF-controlling a power source to said circuit by the control signal.

4. A reference voltage generating circuit comprising:
a first series circuit including a first resistor, a first transistor, a second transistor, and a second resistor coupled in series between power source terminals;
a second series connection circuit including third and fourth transistors which have control electrodes respectively connected to a connection point between said first resistor and said first transistor and a connection point between said second resistor and said second transistor, are coupled in series between said power source terminals, and have a common connection point serving as a reference voltage output terminal; and
a first power source switch connected in series with said first series circuit, for ON/OFF-controlling a power source to said circuit by a first control signal; and
a second power source switch connected in series with said second series circuit, for ON/OFF-controlling said power source to said circuit by a second control signal delayed from the first control signal.

5. A circuit according to claim 4, wherein said first power source switch includes two transistors, each transistor being respectively connected in series between said series circuit and the power source terminals, to be synchronously operated.

6. A circuit according to claim 4, wherein said second power source switch includes two transistors, each transistor being respectively connected in series between said series circuit and the power source terminals, to be synchronously operated.

7. A reference voltage generating circuit comprising:
a first transistor of one conductivity type having a source connected to a first power source terminal and a gate to which a control signal is supplied;
an inverter for inverting a level of the control signal;
a second transistor of an opposite conductivity type having a source connected to a second power source terminal and a gate connected to an output terminal of said inverter;
a first resistor having one terminal connected to a drain of said first transistor;
a second resistor having one terminal connected to a drain of said second transistor;
a third transistor of the opposite conductivity type having a drain and a gate connected to the other terminal of said first resistor;
a fourth transistor of said one conductivity type having a drain and a gate connected to the other terminal of said second resistor and a source connected to a source of said third transistor;
a capacitor having one terminal connected to said source of said fourth transistor and the other terminal connected to said second power source terminal;
a fifth transistor of the opposite conductivity type having a source connected to said second power source terminal, a drain connected to the gate of said third transistor, and a gate to which said control signal is input;
a sixth transistor of said one conductivity type having a source connected to said first power source terminal, a drain connected to the gate of said fourth transistor, and a gate connected to an output terminal of said inverter;
a seventh transistor of the opposite conductivity type having a drain connected to said first power source terminal and a gate connected to the drain of said third transistor; and
an eighth transistor of said one conductivity type having a drain connected to said second power source terminal, a gate connected to said drain of said fourth transistor, and a source connected to said source of said seventh transistor, said source serving as a reference voltage output terminal.

8. A reference voltage generating circuit comprising:

a first transistor of one conductivity type having a source connected to a first power source terminal and a gate to which a first control signal is input;

a first inverter for inverting a level of the first control signal;

a second transistor of an opposite conductivity type having a source connected to a second power source terminal and a gate connected to an output terminal of said first inverter;

a first resistor having one terminal connected to a drain of said first transistor;

a second resistor having one terminal connected to a drain of said second transistor;

a third transistor of the opposite conductivity type having a drain and a gate connected to the other terminal of said first resistor;

a fourth transistor of said one conductivity type having a drain and a gate connected to the other terminal of said second resistor and a source connected to a source of said third transistor;

a capacitor having one terminal connected to said source of said fourth transistor and the other terminal connected to said second power source terminal;

a fifth transistor of said one conductivity type having a source connected to said first power source terminal and a gate to which a second control signal is input;

a second inverter for inverting a level of the second control signal;

a sixth transistor of the opposite conductivity type having a source connected to said second power source terminal and a gate connected to an output terminal of said second inverter;

a seventh transistor of the opposite conductivity type having a drain connected to a drain of said fifth transistor and a gate connected to the drain of said third transistor; and an eighth transistor of the first conductivity type having a drain connected to a drain of said sixth transistor, a gate connected to the drain of said fourth transistor, and a source connected to a source of said seventh transistor, said source serving as a reference voltage output terminal.

* * * * *